(12) United States Patent
Choi et al.

(10) Patent No.: US 11,492,893 B2
(45) Date of Patent: Nov. 8, 2022

(54) APPARATUS AND METHOD FOR PREDICTING A DEFORMED SHAPE OF A STRUCTURE

(71) Applicant: The Texas A&M University System, College Station, TX (US)

(72) Inventors: Junho Choi, College Station, TX (US); Moo-Hyun Kim, College Station, TX (US)

(73) Assignee: THE TEXAS A&M UNIVERSITY SYSTEM, College Station, TX (US)

(*) Notice: Subject to any disclaimer, the term of this patent is extended or adjusted under 35 U.S.C. 154(b) by 180 days.

(21) Appl. No.: 16/618,228

(22) PCT Filed: May 25, 2018

(86) PCT No.: PCT/US2018/034758
§ 371 (c)(1),
(2) Date: Nov. 29, 2019

(87) PCT Pub. No.: WO2018/222555
PCT Pub. Date: Dec. 6, 2018

(65) Prior Publication Data
US 2020/0123891 A1    Apr. 23, 2020

Related U.S. Application Data

(60) Provisional application No. 62/512,292, filed on May 30, 2017.

(51) Int. Cl.
*E21B 17/01* (2006.01)
*E21B 47/007* (2012.01)
(Continued)

(52) U.S. Cl.
CPC ............ *E21B 47/007* (2020.05); *E21B 17/01* (2013.01); *G01M 5/0025* (2013.01); *G01M 5/0041* (2013.01); *G06F 30/23* (2020.01)

(58) Field of Classification Search
CPC .... E21B 17/01; E21B 47/007; G01M 5/0041; G01M 5/0058; G06F 30/23
See application file for complete search history.

(56) References Cited

U.S. PATENT DOCUMENTS 7,080,689 B2 * 7/2006 Guesnon ............... E21B 19/002
166/355
9,593,568 B1 * 3/2017 LeMonds .............. E21B 47/001
(Continued)

FOREIGN PATENT DOCUMENTS

| CN | 202066671 U | 12/2011 |
|---|---|---|
| WO | 2014064190 A2 | 5/2014 |
| WO | 2018222555 A1 | 6/2018 |

OTHER PUBLICATIONS

PCT/US2018/034758 International Search Report and Written Opinion dated Sep. 7, 2018, 12 pages.

*Primary Examiner* — Matthew R Buck
(74) *Attorney, Agent, or Firm* — Boisbrun Hofman, PLLC

(57) ABSTRACT

An apparatus for predicting a deformed shape of a structure, and method of operating and forming the same. In an embodiment, the apparatus is formed with a riser with ends coupled respectively to an upper location and a lower location. The apparatus includes sensors configured to sense an inclination of the riser at riser nodes positioned on the riser between the upper location and the lower location. The apparatus further includes a data processing system configured to produce an estimate of a deformed shape of the riser employing deformed shaped functions to represent, respectively, the estimate of the deformed shape of the riser above and below the riser nodes.

20 Claims, 11 Drawing Sheets

(51) Int. Cl.
*G01M 5/00* (2006.01)
*G06F 30/23* (2020.01)

(56) References Cited

U.S. PATENT DOCUMENTS

| | | | |
|---|---|---|---|
| 2005/0283276 A1* | 12/2005 | Prescott | E21B 47/135 |
| | | | 700/282 |
| 2006/0065401 A1 | 3/2006 | Allen et al. | |
| 2015/0346064 A1* | 12/2015 | Liu | E21B 17/01 |
| | | | 702/188 |
| 2020/0165914 A1* | 5/2020 | Allara | E21B 47/07 |

* cited by examiner

APPARATUS AND METHOD FOR PREDICTING A DEFORMED SHAPE OF A STRUCTURE

CROSS-REFERENCE TO RELATED APPLICATION

This application is the National Stage of, and therefore claims the benefit of, International Application No. PCT/US2018/034758 (WO 2018/222555) filed on May 25, 2018, entitled "APPARATUS AND METHOD FOR PREDICTING A DEFORMED SHAPE OF A STRUCTURE," which claims the priority of Provisional Application No. 62/512,292, entitled "APPARATUS AND METHOD FOR PREDICTING A DEFORMED SHAPE OF A STRUCTURE," filed on May 30, 2017. Both of the above applications are commonly assigned with this National Stage application and are incorporated herein by reference in their entirety.

TECHNICAL FIELD

The present invention relates to an apparatus for predicting a deformed shape of a structure, and method of operating and forming the same.

BACKGROUND

Structures such as risers are slender pipes that are used for transporting natural resources from the seabed and for drilling holes in the seabed to produce oil and gas. One end of a riser is anchored to the seabed, and the other end is attached to a platform that is generally a floating platform. The platform moves continuously due to wind and waves, and the riser is subjected to currents and internal waves. Platform motions and environmental loads are applied to the riser as alternating loads. The recurring loads cause fatigue failure on the riser and may lead to damage on the riser. Once the riser is damaged, an operator should halt using the line, which is referred to as downtime. The downtime leads to money loss for the operator. If the riser failure causes oil leaks, huge expense is incurred to recover the natural environment. Therefore, monitoring the structural integrity of the riser is necessary for effective operation.

SUMMARY

These and other problems are generally solved or circumvented, and technical advantages are generally achieved, by advantageous embodiments of the present invention, including an apparatus for predicting a deformed shape of a structure, and method of operating and forming the same.

In an embodiment, the apparatus is operable with a riser with ends coupled respectively to an upper location and a lower location. The apparatus includes sensors configured to sense an inclination of the riser at riser nodes positioned on the riser between the upper location and the lower location. The apparatus further includes a data processing system configured to produce an estimate of a deformed shape of the riser employing deformed shaped functions to represent, respectively, the estimate of the deformed shape of the riser above and below the riser nodes. In an embodiment, positions, first derivatives, and second derivatives of the deformed shape functions are respectively matched at the riser nodes, and the first derivatives are matched to the inclination of the riser at the riser nodes.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The FIGUREs are drawn to clearly illustrate the relevant aspects of the preferred embodiments and are not necessarily drawn to scale.

DETAILED DESCRIPTION OF ILLUSTRATIVE EMBODIMENTS

Figure 1:
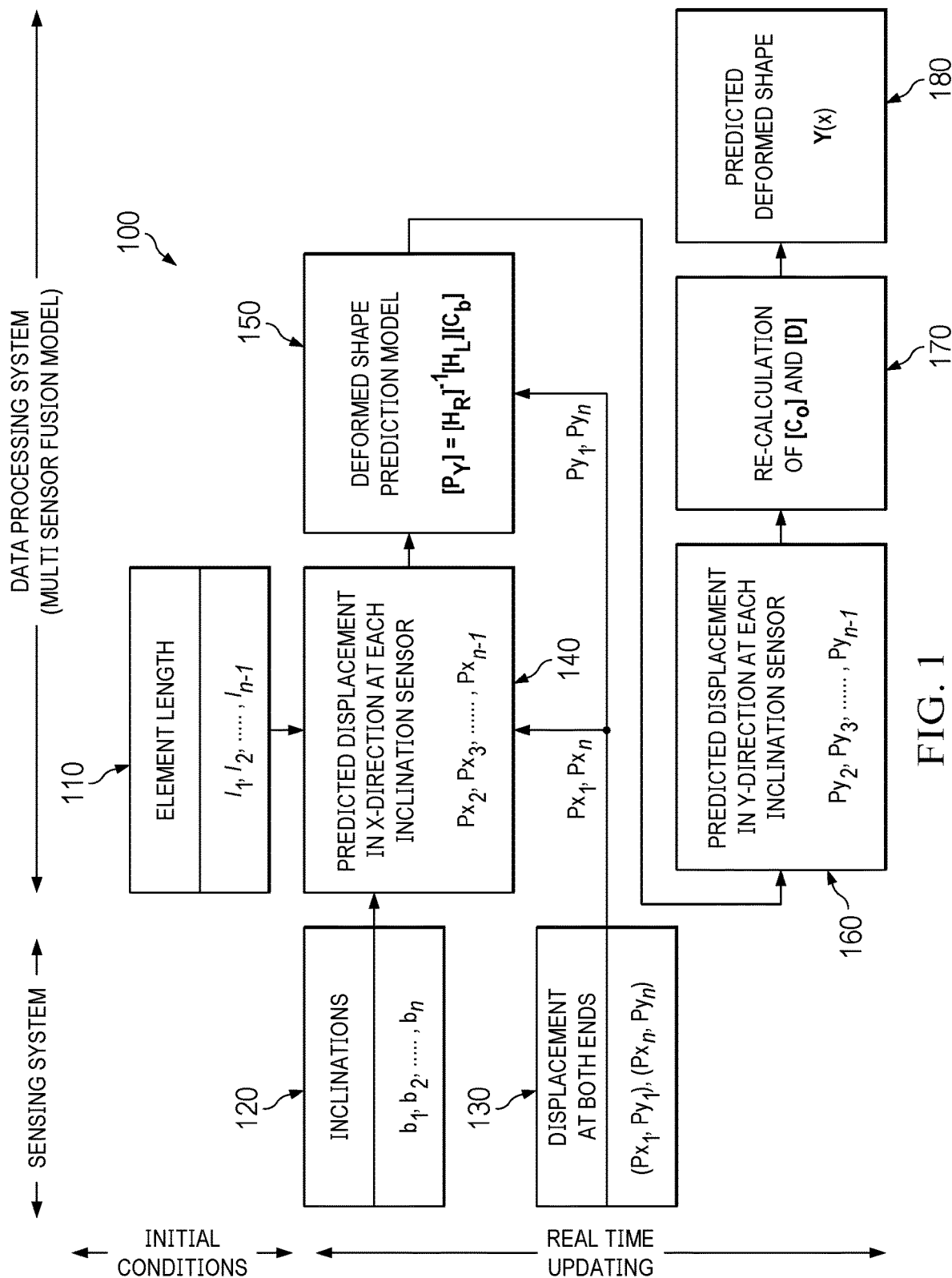
FIG. 1 illustrates a block diagram of an embodiment of a multi-senor fusion system for predicting a deformed shape of a structure.

The making and using of the presently preferred embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Embodiments will be described in a specific context, namely, an apparatus configured to estimate a deformed shape of a structure such as a riser, and method of operating and forming the same. While the principles of the present invention will be described in the environment of estimating a deformed shape of a riser connected between a floating platform and a seabed, any application or related technology that may benefit from an apparatus configured to estimate a deformed shape of a structure such as, without limitation, moorings, cables, and girders of bridges, is well within the broad scope of the present invention.

Many technologies are utilized to evaluate a riser condition. Conventional methods involve visual inspections. Multiple methods take a long time to investigate riser conditions and to analyze data. Otherwise, methods that utilize riser responses, such as acceleration, inclination, strain, and curvature, are more effective than conventional methods in evaluating the integrity of the whole riser. If the deformed shape of the riser can be calculated from the riser responses, evaluating the integrity of the riser is then possible. However, predicting the deformed shape of the riser is difficult.

In mathematics, displacement can be calculated from acceleration using double integration. The displacement obtained from acceleration, however, diverges even though various filtering methods are used. This occurs because of sensor noise and unknown parameters such as initial velocity. Also, acceleration cannot reflect quasi-static motion of a riser.

As introduced herein, a multi-sensor fusion ("MSF") system is developed to overcome limitations of current methods for monitoring of a riser. The MSF system is based on two types of responses, namely, riser inclinations at multiple points and position data of the platform. Applications of the developed method are not limited, as mentioned above, to a riser. Again, other structures such as moorings, cables, girders of bridges, masts of bridges, cable members, booms of cranes, and wings of planes are contemplated within the broad scope of the present invention.

The demands of a structure health monitoring ("SHM") system increase because analyzing the condition of structures is important to sustain structural integrity. Structure health monitoring has been widely deployed in structures, such as long-span bridges and tall buildings. Structure integrity monitoring systems also has been utilized to monitor riser integrity.

A riser is a pipe connected between a platform and the seabed, which is used to drill a hole into the seabed and to produce natural resources. The riser integrity monitoring system includes two parts, namely, a sensing subsystem and a data processing subsystem. The data processing is associated with analyzing measured data including data filtering and structural integrity evaluations. The MSF system can be directly applied to data processing of current riser integrity monitoring systems. The MSF system is utilized for predicting deformed shapes of a riser using riser responses and platform motion. The estimated deformed shapes of the risers can be applied to analyze the fatigue life and to visualize real time movement of risers. The MSF system can also be adapted to calculate the deformed shapes of various structures not limited to risers, such as mooring cables, bridge girders, bridge masts, cable members, crane booms, and plane wings.

A platform continuously moves due to wind, waves and currents. The platform motion affects riser motion because the riser is directly attached to the platform. This is called vessel induced motion ("VIM"). Also, the risers vibrate, which is generated by sea current. This is called vortex induced vibration ("VIV"). These motions act on the riser as alternating forces. Fatigue and buckling failure of a riser can occur due to riser motion induced by the VIM and the VIV.

While present monitoring techniques evaluate the VIM or the VIV only, they cannot evaluate both the VIM and the VIV, simultaneously. In fact, the riser motions mentioned above are reflected in the design process. However, loading conditions considered in the design process are based on probability. Thus, identifying all natural phenomena and critical events that can lead to riser damage or failure is very difficult.

Recently, environmental loads such as wind and waves have been dramatically altered because of climate change. For instance, some platforms designed in the past now endured harsher conditions compared to the original design conditions. Furthermore, errors occur during fabrication and installation processes. Once a riser is damaged for any reason, producing oil is suspended. Of course, the suspension of operations leads to a loss from the down time. Furthermore, if oil leaks are produced due to damage of the riser, the operating company can endure a huge recovery cost.

Many offshore platforms are close to their design life. One of their issues is extending a service life of the platform including riser systems and mooring systems. In general, the service life is longer than the design life. The structure condition should satisfy requirements of regulations to extend the structural life, such that structural inspection is mandatory. Inspection of the riser is more difficult than the platform structure due to under-water conditions. The monitoring system assists to maintain riser integrity from uncertainties, which are included in the design, fabrication and installation processes. The MSF system can be used to monitor riser motion, including both the VIV and the VIM, so the MSF system can be applied to various types of risers. Therefore, the MSF system plays a significant role for the riser integrity system and it helps to augment or optimize operational costs for the operating company.

The riser integrity monitoring methods can be categorized into two parts, namely, a local method and a global method. The local method is used to directly identify riser damage using techniques such as visual inspection, ultrasonics, radiography, electromagnetics and magnetic flux leakage. Typically, the local method is periodically performed because it needs specialized equipment, trained technicians and a huge budget. The local method is limited to finding the damage at the sensor location and does not acquire actual historical behavior. Due to these facts, a local method is not appropriate for monitoring riser behavior. Thus, a global method may be more appropriate.

The global method is used to estimate long-term behavior and to calculate fatigue life using measured riser responses such as accelerations, strains, curvatures and inclinations. In detail, the global method includes a sensing and a data processing system. The sensing is responsible for collecting structural responses from the sensors, and data processing performs structural integrity evaluations including data filtering. In fact, to acquire riser responses, sensors such as acceleration sensors, strain gages, inclination meters, angular rate sensors, and curvature sensors have been deployed on risers, as described by Mercan, et al. in "Comparison of Riser Fatigue Methodologies Based on Measured Motion Data," Offshore Technology Conference, Houston, Tex. (2016), Kang, et al. "Dynamic Response Control of Top-tension Risers by a Variable Damping and Stiffness System with Magneto-rheological Damper," Proceedings of the ASME 2014, 33rd International Conference on Offshore Mechanics and Arctic Engineering, San Francisco, Calif., Thethi, et al. in "A Fatigue Monitoring Strategy and Implementation on a Deepwater Top Tensioned Riser," Offshore Technology Conference, Houston, Tex. (2005), Peng, et al. in "A State-of-the-art Review on Structural Health Monitoring of Deepwater Floating Platform," Pacific Science Review, 14, No: 3: pp. 253-263 (2012), Podskarbi, et al. in "Review and Evaluation of Riser Integrity Monitoring Systems and Data Processing," Deep Offshore Technology (2006), Podskarbi, et al. in "Design Consideration of Monitoring Systems for Deepwater Steel Catenary Risers," The Seventeenth International Offshore and Polar Engineering Conference, 1-6 July, Lisbon, Portugal (2007), Cook, et al. in "Riser Integrity Management for Deepwater Developments," Offshore Technology Conference, Houston, Tex. (2006), Karayaka, et al. in "Tahiti Online Monitoring System for Steel Catenary Risers and Flowlines," Offshore Technology Conference, Houston, Tex. (2009), and Karayaka, et al. in "Steel Catenary Riser Response Characterization with on-line Monitoring Devices," Proceedings of 28th International Conference on Offshore Mechanics and Arctic Engineering, Honolulu, Hi. (2009), which documents are incorporated herein by reference. In data analysis, many methods are applied to analyze structural integrity using measured responses on a riser. The characteristics of the methods are tabulated in Table 1.

TABLE 1

Riser Integrity Analysis Methods

| Analysis Method | Modal decomposition and reconstruction method | Transfer Function Method | Analytical Method |
|---|---|---|---|
| Riser response | VIV | Wave and VIV | |
| Fatigue monitoring location | Along the riser | At sensor location only | |
| Limitation | Linear system and added mass | Uncertainties of structural damping, drag coefficient | Analytical equation |

However, limitations exist with conventional methods. These limitations can be divided into three categories, namely, needs of accurate analysis model such as a finite element ("FE") model, considering nonlinear responses, and eliminating measuring noise. The MSF system is introduced herein to overcome limitations of conventional methods.

The development stage of processes introduced herein can be explained briefly when it refers to a technology readiness level ("TRL"). Technology maturity as disclosed herein can be located in TRL 3, which means analytical and experimental critical function and/or characteristic proof of concept. A system model is introduced herein, and its availability is validated using a computer simulation tool.

A computer simulation has been performed to verify the MSF system. Verification models, which are quasi-static and dynamic response models, are constructed using FE models. Based on the MSF model, an executable program is created using MATLAB®. In the case of a quasi-static model, four different types of structures are chosen to reflect geometry and boundary nonlinearities of riser motion. It is noted that quasi-static results cannot be compared to other methods based on vibration because quasi-static response means that acceleration is zero.

The results of the MSF system substantially match exact riser displacements. In the case of dynamic response models, a column is modeled to produce vertical riser motion. To compare estimation results between the MSF system and a conventional method using acceleration, white noise signals are inserted into acceleration and inclination signals, so the displacements estimated by acceleration diverge. Otherwise, the displacements calculated by the MSF system do not diverge. As set forth herein, the validity of the MSF system has been verified.

The MSF system has been verified in cases of simple beam structures, which can represent the behavior of a riser. The MSF system can be applied to predict the deformed shape of a riser. To do this, the MSF model should be expanded into three-dimensional space, because a present MSF model is derived in two-dimensional space. The accuracy of the predicted deformed shape is affected by the sensor arrangement including the number of sensors and the distance between sensors. Parametric studies with respect to sensor arrangement can be performed. The results of the MSF system show that the predicted displacement contains a white noise effect when white noise is considered in inclination data. To diminish the noise effect, enclosing additional sensor data into MSF model is considered.

As mentioned above, the MSF system includes two systems, namely, a sensing subsystem and a data processing subsystem. The sensing subsystem is for measuring inclination along a riser at multiple points and displacement at the ends of riser. The data processing subsystem predicts a deformed shape of the riser from data obtained by the sensing subsystem. The MSF model is an algorithm in the data processing subsystem.

Ends of a riser are respectively anchored to the seabed and attached to a platform. In most cases, a global navigation satellite system ("GNSS") or a platform position monitoring system, which is included in dynamic positioning systems, is employed in the platform to monitor platform motion. Sensors, such as accelerometers, inclination meters (or inclinometer), and strain gages, are also used to measure responses of the riser. Inclination meters and/or strain gauges can be used to measure inclination, and accelerometers can be used to enhance the predicted displacement at each sensor point. There is a limitation that only an inertial measurement unit ("IMU") or contact-type sensors can be deployed for monitoring riser responses due to under-water conditions.

Turning now to FIG. 1, illustrated is a block diagram of an embodiment of a multi-senor fusion ("MSF") system 100 for predicting a deformed shape of a structure such as a riser. The MSF system 100 includes an initial condition module or subsystem 110 wherein initial conditions (e.g., element lengths of the riser) are provided thereto. A first sensing module or subsystem 120 senses inclinations along the riser, and a second sensing module or subsystem 130 senses a displacement at both ends of the riser. A first prediction module or subsystem 140 predicts displacements along the riser in an x-direction at each sensor such as an inclination sensor based on the inclinations and the displacements at both ends of the riser.

The MSF system 100 then produces a deformed shape prediction model based on the prediction of the displacements along the riser and displacements along the riser at a second prediction module or subsystem 150. A third prediction module or subsystem 160 predicts displacements along the riser in a y-direction at each sensor such as an inclination sensor based on the deformed shape prediction model. The MSF system 100 calculates/re-calculates matrices [Co] and [D] at a matrices calculation module or subsystem 170. A fourth prediction module or subsystem 180 predicts a deformed shape of the riser.

The MSF system employs inclination values at multiple points along the riser and position values at both ends of the riser. These values are updated, for example periodically, in succeeding time steps. A total of n inclinometers may be installed on each riser. Inclinometers are located at both ends of each riser, and n−2 inclinometers are installed at a sequence of arbitrary points along the riser. The position of the end of the riser that is anchored to the seabed is considered a fixed coordinate, and the specific coordinate point of the other end that is attached to the platform is obtained from the platform position sensing system. Sensing details that are used for deploying the MSF system are shown below in Table 2.

TABLE 2

Measurement Conditions

| Sensor Location | Number of sensors | Measured responses |
|---|---|---|
| Start and end | Mandatory locations | 2 | Displacement (2 Axis) |
| | | 2 | Inclination |
| Along the riser | Arbitrary locations | n-2 | Inclination |

Figure 2:
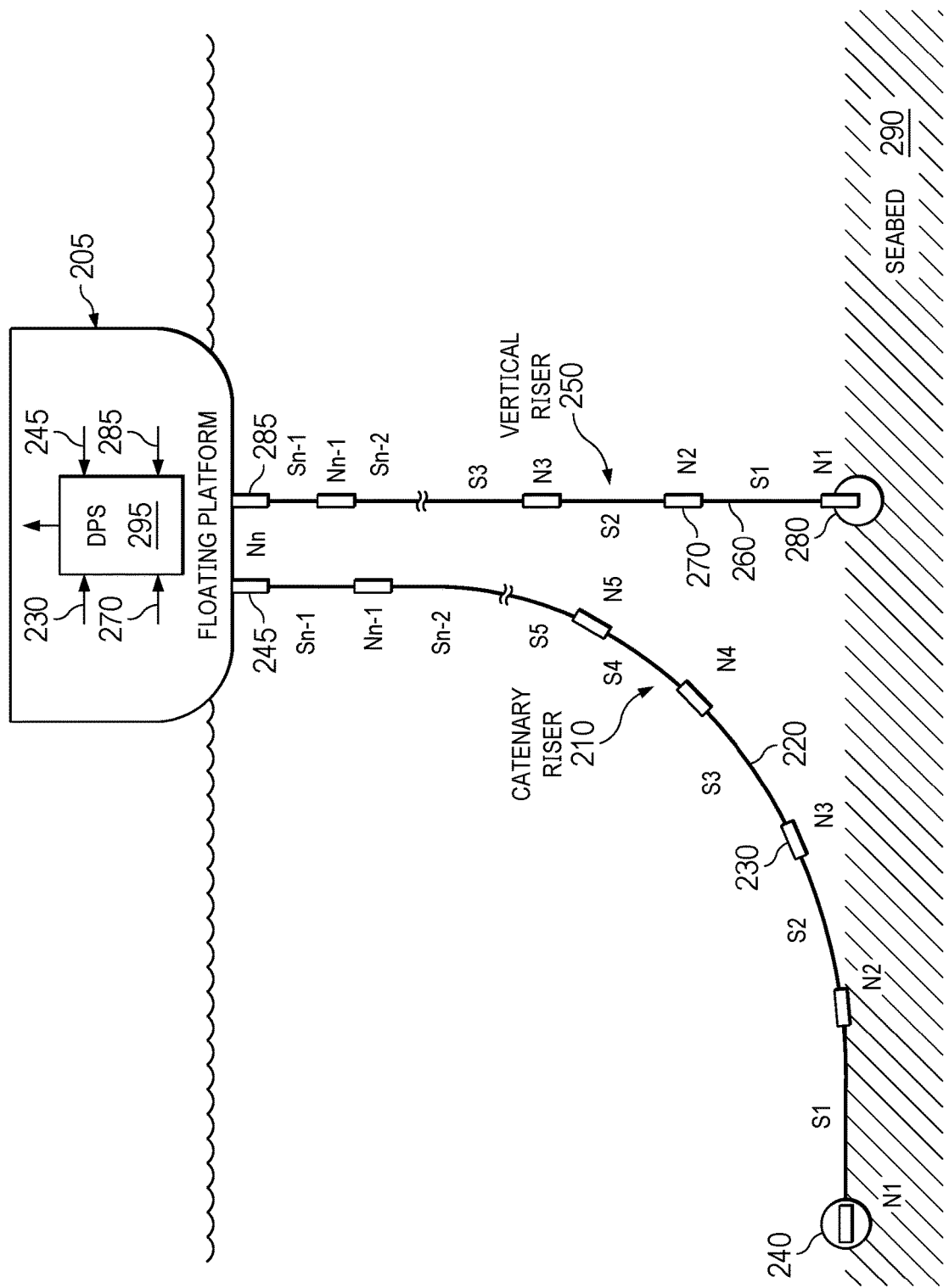
FIG. 2 illustrates a diagram of an embodiment of a configuration of a riser monitoring system.

Turning now to FIG. 2, illustrated is a diagram of an embodiment of a configuration of a riser monitoring system. An upper location (e.g., a floating platform 205) is secured by risers, a catenary riser 210 and a vertical riser 250 at anchor points 240, 280, respectively, to a lower location (e.g., a seabed 290). The catenary riser 210 has a plurality of segments (S1, S2, . . . , Sn-1, and one of which is designated 220) separated by nodes (illustrated as rectangular nodes N1, N2, . . . , Nn) with a sensor (e.g., an inclination sensor, one of which is designated 230) at each node. The vertical riser 250 has a plurality of segments (S1, S2, . . . , Sn-1, and one of which is designated 260) separated by nodes (illustrated as rectangular nodes N1, N2, . . . , Nn) with a sensor (e.g., an inclination sensor, one of which is designated 270) at each node. A position sensor 245, 285 is configured to estimate a position of the floating platform 205 of the catenary riser 210 and the vertical riser 250, respectively. A model for calculating displacement of a riser from inclinations and predicting deformed shapes of the riser operable on a data processing system ("DPS") 295 in communication with the sensors (e.g., inclination sensors 230, 270 and/or position sensors 245, 285) is introduced herein.

Figure 3:
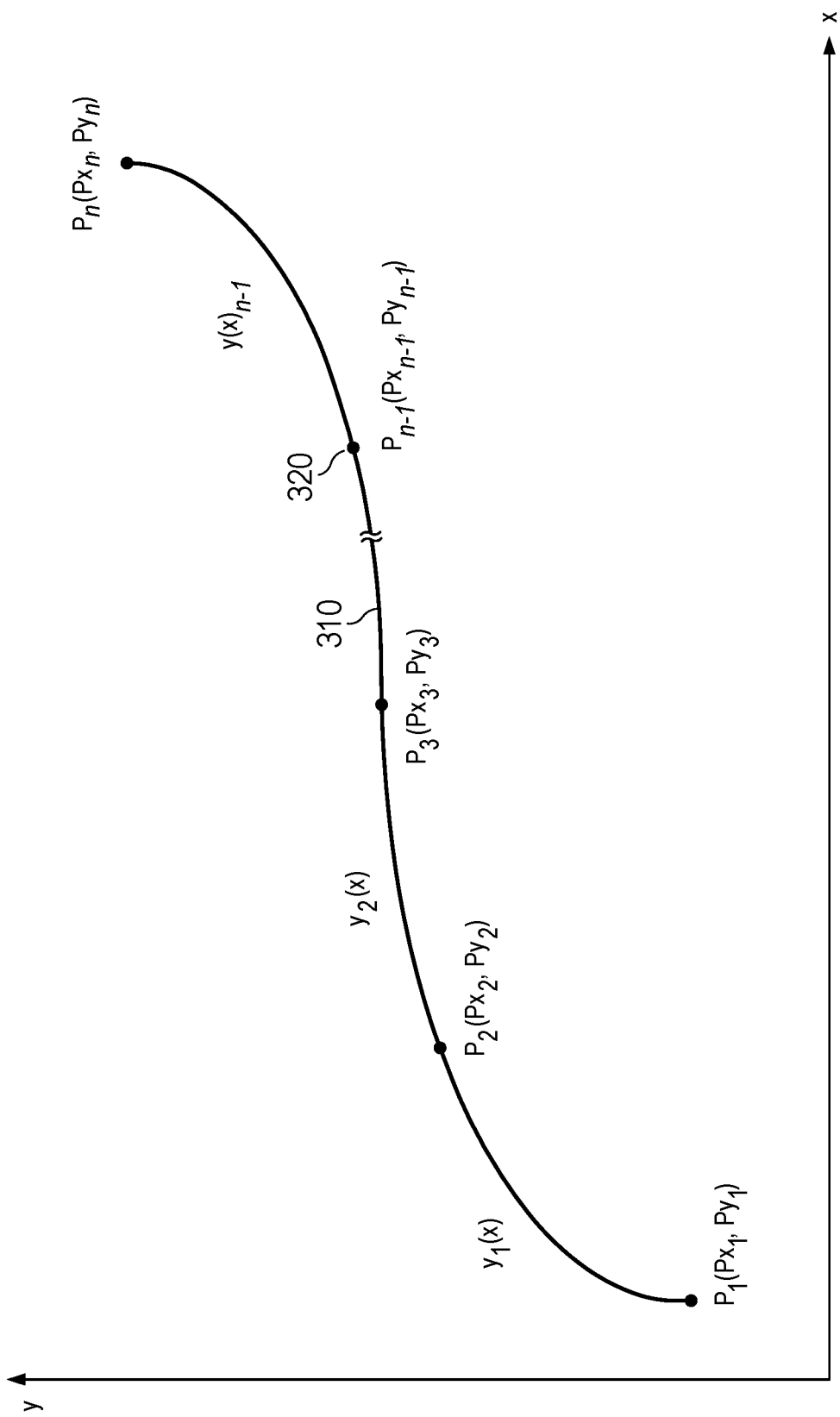
FIG. 3 illustrates a graphical representation of an embodiment of a deformed shape of a structure.

Turning now to FIG. 3, illustrated is a graphical representation of an embodiment of a deformed shape of a structure such as a riser. In the data processing system, deformed shapes of the riser are calculated in accordance with the times of measured riser responses, which are collected in the sensing system. A riser is a slender structure, so deformed shapes of a riser can be described as smooth curves. A smooth curve is mathematically defined as a continuous and differentiable curve. Even though a riser is composed of various sections, the condition of a smooth curve is satisfied except in the case of failure due to local buckling. When local buckling occurs, its deformed shape cannot be differentiated at the failure point. Therefore, assuming that deformed shapes of a riser are considered smooth curves is applicable.

A riser can be divided into n number of nodes such as node 320 and n−1 number of elements, segments or sections between the nodes, such as element 310. Positions $P_1$ ($P_{X1}$, $P_{Y1}$) and $P_n$($P_{Xn}$,$P_{Yn}$) indicate both end nodes of the riser. The deformed shape of the riser can be expressed by a high degree polynomial function. The polynomial function generally requires n+1 measurement values to apply an $n^{th}$ degree polynomial equation. This implies that the deformed shape function is determined with respect to the number of measurement values. So, a large amount of data processing is used for a high degree polynomial function. Thus, using such a polynomial function is not suitable or otherwise practical for predicting a complex deformed shape.

Otherwise, the deformed shape function of each element can be expressed by individual functions $y_i$ that can also be expressed as a polynomial function $y_i(x)$. A third-order polynomial function is used to generate a smooth curve. The deformed shape function of the first element is shown below in Equation (Eq.) 1.

$$y_1(x)=a_1+b_1(x-Px_1)+c_1(x-Px_1)^2+d_1(x-Px_1)^3, \text{ where } Px_1 \leq x \leq Px_2 \quad \text{Eq. (1)}$$

Eq. 1 can be generalized into Eq. 2 as set forth below.

$$y_1(x)=a_1+b_1(x-Px_1)+c_1(x-Px_1)^2+d_1(x-Px_1)^3, \text{ where } Px_{n-1} \leq x \leq Px_n \quad \text{Eq. (2)}$$

The x- and y-coordinates are local coordinates. The coefficients ci, and d, denote coefficients of the deformed shape function. For n number of nodes, n-1 number of elements deformed shape functions (y) are employed. A deformed shape function of a whole structure is obtained by connecting the deformed shape functions of elements. The deformed shape function of global structure is shown below in Eq. 3.

$$Y(x) = y_1(x) + y_2(x) + \ldots + y_{n-1}(x) = \sum_{i=1}^{n-1} y_i(x) \quad \text{Eq. (3)}$$

The following procedure explains how to determine the unknown coefficients ai, bi, $c_i$, and di.

Figure 4:
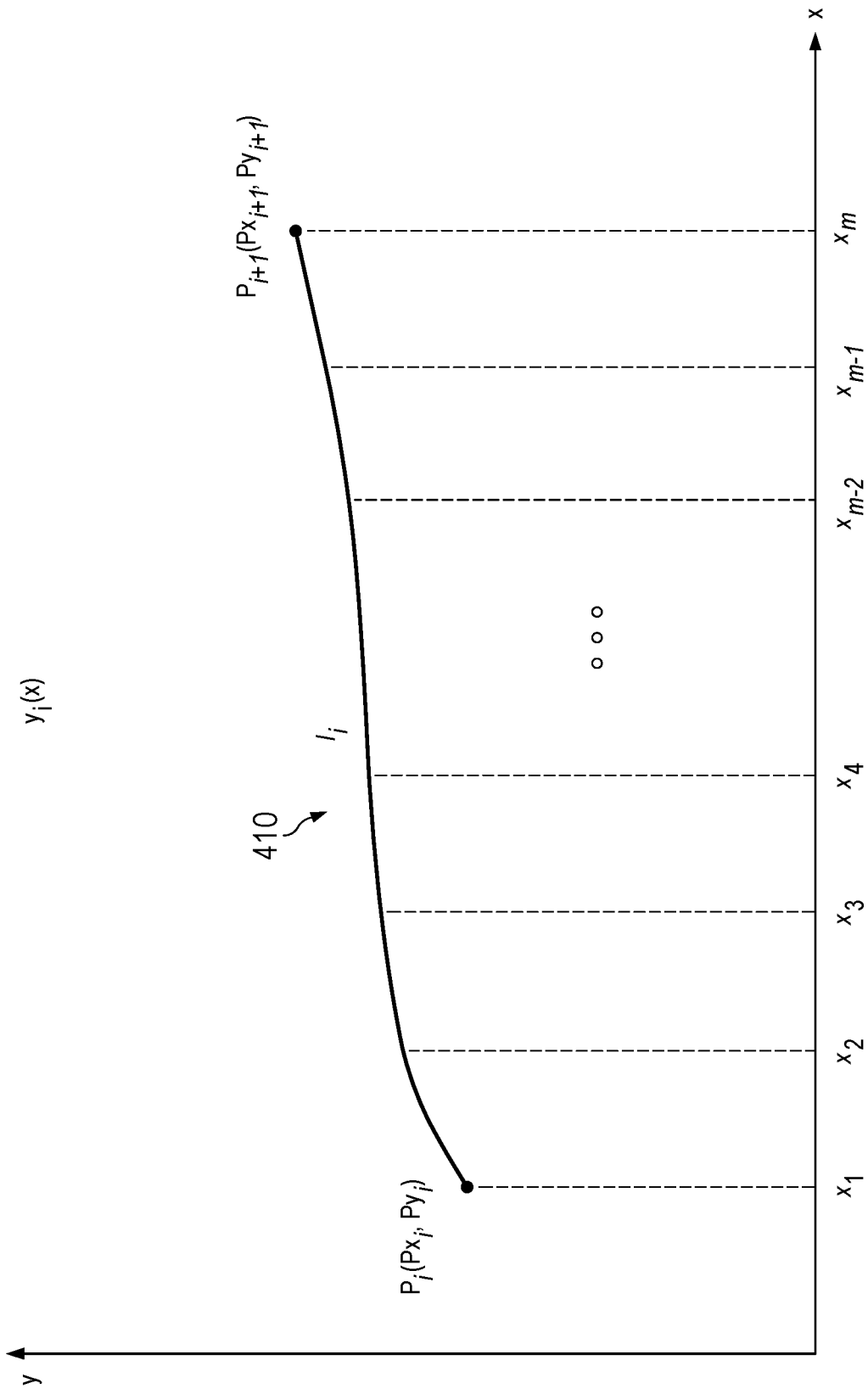
FIG. 4 illustrates a graphical representation of an embodiment of a configuration of an element of a structure.

Turning now to FIG. 4 illustrated is a graphical representation of an embodiment of a configuration of the $i^{th}$ element 410 of a structure such as a riser. One of the end coordinates is $P_i$ ($Px_i$, $Py_i$) and the other is $P_{i+1}$($Px_{i+1}$, $Py_{i+1}$). The length of the $i^{th}$ element 410 is $l_i$. The deformed shape function of element i is represented in Eq. 4.

$$y_i(x)=a_i+b_i(x-Px_i)+c_i(x-Px_i)^2+d_i(x-Px_i)^3 \quad \text{Eq. (4)}$$

The first derivative and the second derivative of Eq. 4 are Eq. 5 and Eq. 6, respectively.

$$y_i'(x)=b_i+2c_i(x-Px_i)+3d_i(x-Px_i)^2 \quad \text{Eq. (5)}$$

$$y_i''(x)=2c_i+6d_i(x-Px_i) \quad \text{Eq. (6)}$$

Both of the end coordinates are substituted into Eq. 4. The coefficient $a_i$ can be determined as shown in Eq. 7.

$$y_i(P_{xi}):a_i=P_{Yi} \quad \text{Eq. (7)}$$

Once the coefficient $a_i$ is obtained, Eq. 8 can be obtained.

$$y_i(P_{Xi}+h_i):P_{Yi}+b_i \cdot h_i+c_i \cdot h_i^2+d_i \cdot h_i^3=P_{Yi+3}, \text{ where } P_{Xi+3}=P_{Xi}+h_i \quad \text{Eq. (8)}$$

The first derivatives and the second derivatives of ambient element deformed shape functions are equal at the nodes where two elements are connected. The first derivatives and the second derivatives are represented by Eq. 9 and Eq. 10, respectively.)

$$y_i'(P_{Xi+1})=y_{i+1}'(P_{Xi+1}):b_i+2c_i \cdot h_i+3d_i \cdot h_i^2=b_{i+1} \quad \text{Eq. (9)}$$

$$y_i''(P_{Xi+1})=y_{i+1}''(P_{Xi+1}):c_i+3d_i \cdot h_i=c_{i+1} \quad \text{Eq. (10)}$$

When Eq. 10 is solved in terms of $d_i$, Eq. 11 is obtained.

$$d_i = \frac{c_{i+1} - c_i}{3h_i} \quad \text{Eq. (11)}$$

Eq. 11 can be substituted into Eq. 9 to give Eq. 12.

$$b_i + 2c_i \cdot h_i + (c_{i+1} - c_i) \cdot h_i = b_{i+1} \quad \text{Eq.(12)}$$

Eq. 12 can be solved for Eq. 13.

$$c_{i+1} = \frac{b_{i+1} - b_i}{h_i} - c_i \quad \text{Eq. (13)}$$

Eq. 14 can be obtained by substituting Eq. 11 into Eq. 8.

$$P_{Y_i} + b_i \cdot h_i + \frac{h_i^2}{3}(2c_i + c_{i+1}) = P_{Y_{i+1}} \quad \text{Eq. (14)}$$

By transferring Eq. 14. Eq. 15 is obtained.

$$b_i = \frac{P_{Y_{i+1}} - P_{Y_i}}{h_i} - \frac{h_i}{3}(2c_i + c_{i+1}) \quad \text{Eq. (15)}$$

Representing Eq. 15 in terms of the i-1 element gives Eq. 16.

$$b_{i-1} = \frac{P_{Y_i} - P_{Y_{i-1}}}{h_{i-1}} - \frac{h_{i-1}}{3}(2c_{i-1} + c_i) \quad \text{Eq. (16)}$$

Eq. 17 is obtained by substituting Eq. 16 and Eq. 15 into changed Eq. 12 in terms of i-1.

$$h_{i-1} \cdot c_{i-1} + 2(h_{i-1} + h_i)c_i + h_i \cdot c_{i+1} = \quad \text{Eq. (17)}$$
$$3\left(\frac{P_{Y_{i-1}}}{h_{i-1}} - P_{Y_i}\left(\frac{1}{h_{i-1}} + \frac{1}{h_i}\right) + \frac{P_{Y_{i-1}}}{h}\right)$$

An n-3 number of simultaneous equations are obtained from Eq. 17. Eq. 17 is applied from the second element (i=2) to n-2 element (i=n-2). However, the number of unknowns is n-1. Therefore, two additional conditions are needed. If the second derivatives at the starting point and the end point of the structure are equal to zero, two additional equations, $c_i=0$ and $c_2=0$, are obtained. The final equations can be expressed in matrix form as shown in Eq. 18.

$$[H_L] \cdot [C_o] = [H_R] \cdot [P_y] \quad \text{Eq. (18)}$$

where the matrices $[H_L]$, $[H_R]$ $[C_o]$, and $[P_y]$ are given by:

$$H_L = \begin{bmatrix} 1 & & & & \\ h_1 & 2(h_1+h_2) & h_2 & & \\ & h_2 & 2(h_2+h_3) & h_3 & \\ & & & \vdots & \\ & & h_2 & 2(h_2+h_3) & h_3 \\ & & & & 1 \end{bmatrix} \quad C_O = \begin{bmatrix} c_1 \\ c_2 \\ c_3 \\ \vdots \\ c_{n-1} \\ c_n \end{bmatrix}$$

-continued $$H_R = \begin{bmatrix} 0 & & & & \\ 3/h_1 & -3(1/h_1+1/h_2) & 3/h_2 & & \\ & 3/h_2 & -3(1/h_2+1/h_3) & 3/h_3 & \\ & & \vdots & & \\ & & 3/h_{n-2} & -3(1/h_{n-2}+1/h_{n-1}) & 3/h_{n-1} \\ & & & & 0 \end{bmatrix} \quad P_y = \begin{bmatrix} Py_1 \\ Py_2 \\ Py_3 \\ \vdots \\ Py_{n-1} \\ Py_n \end{bmatrix}$$

If coordinates of the nodes are known, the deformed shape functions of the elements can be calculated using Eq. 18. However, the measurable response of the riser is inclination. The inclination value can be substituted into 13. The value of c, can be transferred to the function of bi, hi, and ci by substituting Eq. 13 into the matrix [Co] in Eq. 18. As stated previously, ci equals zero. Thus, the matrix [Co] can be changed to Eq. 19 (where T denotes a transpose).

$$C_b^T = \left[ c_1 \quad \frac{b_2 - b_1}{h_1} - c_1 \quad \frac{b_3 - b_2}{h_2} - \right. \quad \text{Eq. (19)}$$
$$\left. c_2 \quad \ldots \quad \ldots \quad \frac{b_{n-1} - b_{n-2}}{h_{n-2}} - c_{n-2} \quad \frac{b_n - b_{n-1}}{h_{n-1}} - c_{n-1} \right]$$

Using Eq. 18 and Eq. 19, Eq. 21 is obtained. Also, using Eq. 11, the matrix ID] (e.g., its transpose) can be calculated as shown in Eq. 20.

$$D^T = \left[ \frac{c_2 - c_1}{3h_1} \quad \frac{c_3 - c_2}{3h_2} \quad \ldots \quad \ldots \quad \frac{c_{n-2} - c_{n-3}}{3h_{n-3}} \quad \frac{c_{n-1} - c_{n-2}}{3h_{n-2}} \right] \quad \text{Eq. (20)}$$

Finally, displacement of the y-direction at each sensor point can be calculated from Eq. 21.

$$[P_y] = [H_R]^{-1} [H_L] \cdot [C_b] \quad \text{Eq. (21)}$$

As previously assumed, when c, equals zero, Eq. 19 can be expressed in relation to the inclination at each sensor point and the distance of the x-direction between those points. Thus, there are two unknown parameters in Eq. 19 which lead to the consideration of an additional condition. If length alternation of the structure is negligible, length is same in both the deformed and the undeformed states. The following equations assume that the length of each slender rod element is the same in each time steps. The length of curve can be calculated by Eq. 22 or Eq. 23:

$$\ell_i = \int_{x_i}^{x_{i+1}} \sqrt{1 + y_i'(x)^2} \, dx \quad \text{Eq. (22)}$$

$$\ell_i = \lim_{m \to \infty} \sum_{k=1}^{m} \sqrt{(x_{k+1} - x_k)^2 + (y_i(x_{k+1}) - y_i(x_k))^2}, \quad \text{Eq. (23)}$$

where $x = [Px_i, Px_{i+1}]$ and $k = 1, 2, 3, 4, \ldots, m$

Eq. 24 is obtained by substituting Eq. 4 into Eq. 23:

$$\ell_i = \sum_{k=1}^{m-1} \sqrt{\left(\begin{array}{c} dx^2 + \\ b_i \cdot dx + c_i \cdot ((k+1)^2 - k^2) \cdot dx^2 + \\ \left(\dfrac{b_{i+1} - b_i}{3((m-1) \cdot dx)^2} - \dfrac{2c_i}{3((m-1) \cdot dx)}\right) \cdot \\ ((k+1)^3 - k^3) \cdot dx^3 \end{array}\right)^2}, \quad \text{Eq. (24)}$$

where $dx = \dfrac{Px_{i+1} - Px_i}{m-1}$

The variables in and dx are determined by solving Eq. 24. Each distance of the x-direction between sensor points, noted as h is calculated using Eq. 25.

$$h_i = m \times dx \quad \text{Eq. (25)}$$

The horizontal length of the entire riser is determined by adding each horizontal distance. If measured inclination values have no errors and the riser satisfies an inextensible condition, the horizontal length of the entire riser ($h_t$) should match up with the difference between the end points ($Px_n - Px_i$) in Eq. 26. If an error occurs, the equation of the error can be calculated as in Eq. 26.

$$e = (Px_n - Px_i) - \sum_{i=1}^{n-1} h_i \quad \text{Eq. (26)}$$

The error of $h_i$ is influenced by ambient elements. Therefore, the error calculated in Eq. 26 should be appropriately distributed. In Eq. 24, we have assumed that the length of a riser does not change. However, in a real life setting, when the length of a riser changes and the same degree of errors occurs in either the small inclination or the large inclination elements, the error that occurred in the x-direction of a small inclination will be greater than that of the elements with stiffer inclination. Therefore, elements with less inclination have a much more sensitive h, value based on the degree of the error. This also means that a smaller value of d, the coefficients of the deformed shape function, employs more distribution of the error. In order to effectively distribute the error, Eq. 27 is used to calculate the magnitude of the error.

$$h_i^u = h_i - e\left|\dfrac{\alpha}{\beta d_i}\right|, \text{ where } \alpha = \sum_{i=1}^{n-1}|d_i|, \beta = \sum_{i=1}^{n-1}\left|\dfrac{\alpha}{d_i}\right| \quad \text{Eq. (27)}$$

Now, $h_i''$ is plugged into h, of [$H_L$] and [HR] in Eq. 18. The matrix [$C_b$] is calculated by substituting $h_i''$ into h, as well as substituting measured inclination values into bi in Eq. 19. Next, the measured y-coordinate value of both ends of the riser are plugged into the elements of matrix Py, Py 1 and Pyn. The matrix Py can be determined by solving Eq. 28.

$$[P_y] = [H_R]^{-1}[H_L] \cdot [C_o] \quad \text{Eq. (28)}$$

Thus, the MSF system may be applied to a nonlinear system, a finite element model is applied to process data, and the system is stable; even though the measured signal is contaminated by noise, the predicted result does not diverge. The verification process described herein supports features of the MSF system. Geometry and boundary nonlinear analyses are performed to verify the MSF system. Dynamic analyses are carried out as well. Quasi-static and dynamic responses are employed from nonlinear analyses and dynamic analyses, respectively. Five verification structures are modeled using the finite element method.

Figure 5C:
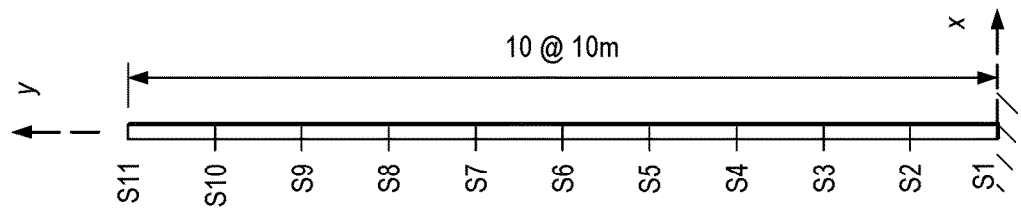
FIGS. 5a, 5b and 5c illustrate diagrams of embodiments of verification models of a structure.
Figure 5A:
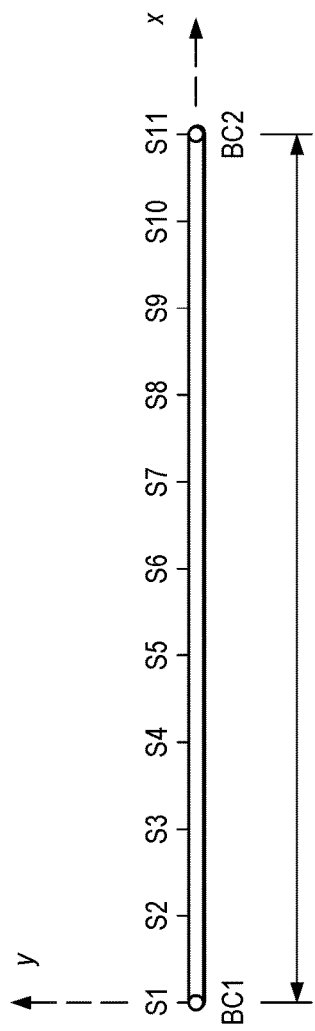
Figure 5B:
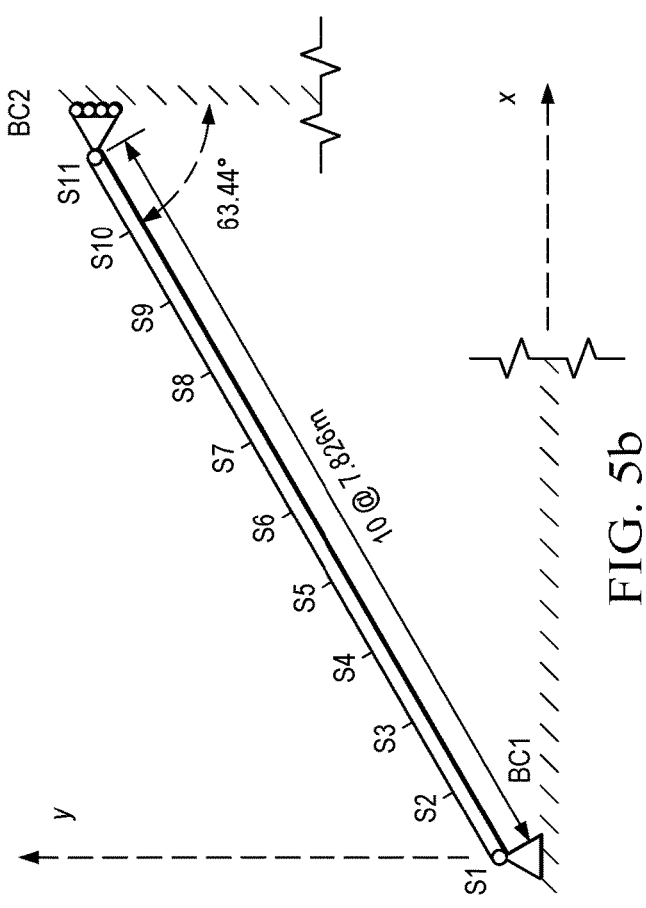

Turning now to FIGS. 5a, 5b and 5c, illustrated are diagrams of embodiments of verification models of a structure such as a riser. Configurations of the verification models and boundary conditions are shown in FIGS. 5a, 5b and 5c, and Table 3, respectively. Three of the five models are horizontal beams (FIG. 5a, horizontal beam model); one is an inclined beam (FIG. 5b, inclined beam model), and one is a column (FIG. 5c, column model). The quasi-static force acts in the y-direction at locations S6 shown in FIGS. 5a and 5b in horizontal and inclined beams. In the column model, various impact forces are applied in the x-direction along the structure. Locations S1, S2 . . . and S11 indicate sensor points in FIGS. 5a, 5b and 5c. It is important note that the responses that can be measured on a riser are inclinations, which means that the actual displacement at each of the sensor points are not known. The MSF system predicts displacement at each sensor point, and then calculates deformed shapes of the riser from estimated displacement at the sensor points.

TABLE 3

Detailed information of verification models

| Model Case | Analysis Case | Boundary Condition ("BC") | |
|---|---|---|---|
| | | BC1 | BC2 |
| GS-SIMPLE | Geometry | Hinge | Roller |
| GS-CANTILEVER | nonlinear static | Free | Fix |
| GS-FIXEDSIMPLE | | Hinge | Fixed Roller |
| GBS-INCLINED | Geometry and boundary nonlinear static | Hinge | Vertical roller |
| LD-COLUMN | Linear dynamic | Fixed | Free |

Figure 6:
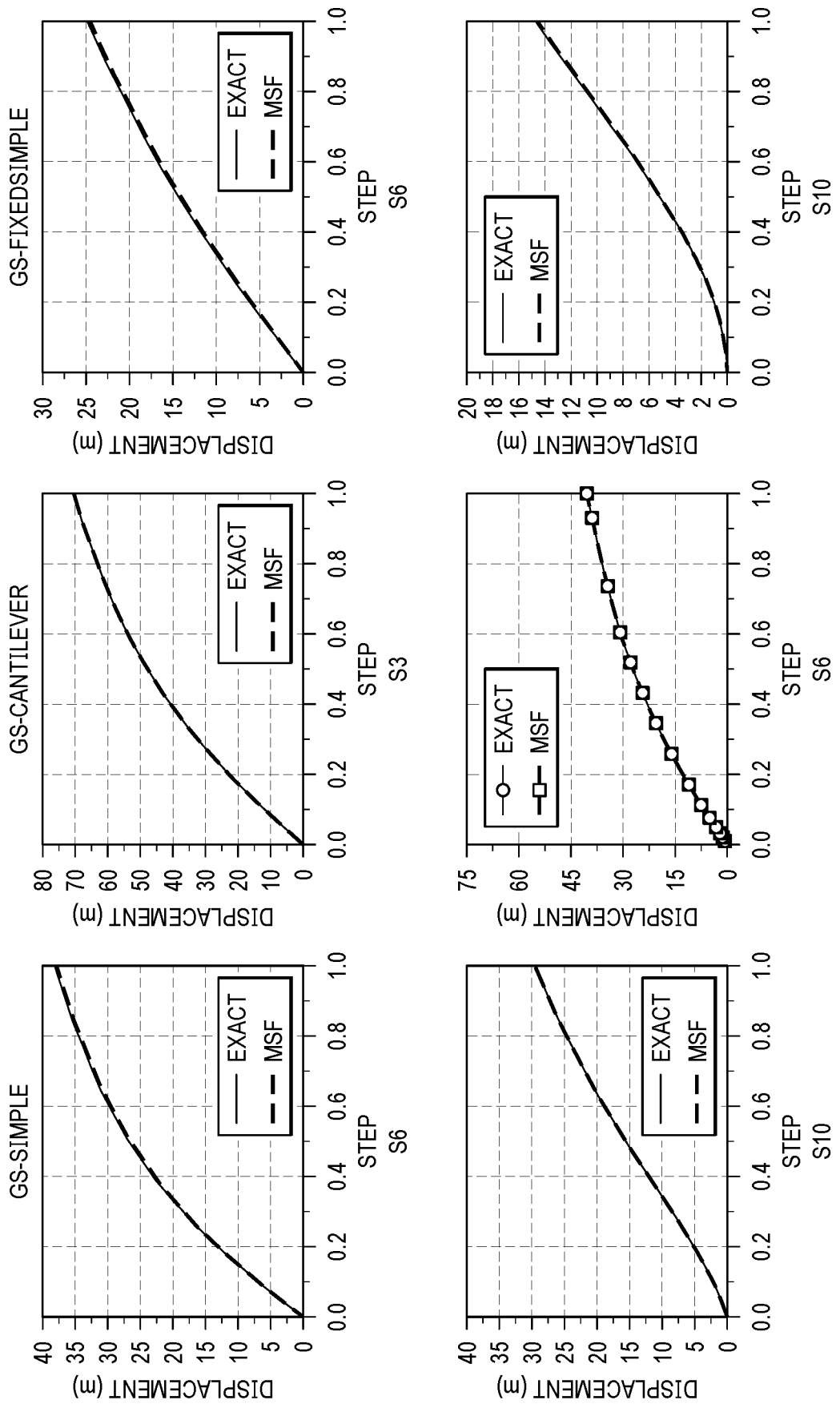
FIG. 6 illustrates graphical representations of embodiments of predicted displacement of geometry nonlinear behavior.

Turning now to FIG. 6, illustrated are graphical representations of embodiments of predicted displacement of geometry nonlinear behavior. The curves illustrated in FIG. 6 represent the exact and predicted displacement at sensor points of horizontal beam cases from an intact signal, which are GS-SIMPLE, GS-CANTILEVER, and GS-FIXED-SIMPLE. According to a small displacement theory, displacement in the y-direction is a dominant response, and displacement in the x-direction can be negligible. Otherwise, displacement in the x direction should be calculated in large displacement theory or, more specifically, geometry nonlinearity. Thus, displacement in this section is the resultant displacement of the x and y direction, which is calculated from Eq. 29. Estimated results are shown in FIG. 6, and all results are correlated to the exact values. The MSF system is valid in terms of geometry nonlinearity responses.

$$\delta_{xy} = \sqrt{\delta_x^2 + \delta_y^2} \quad \text{Eq.(29)}$$

Figure 7:
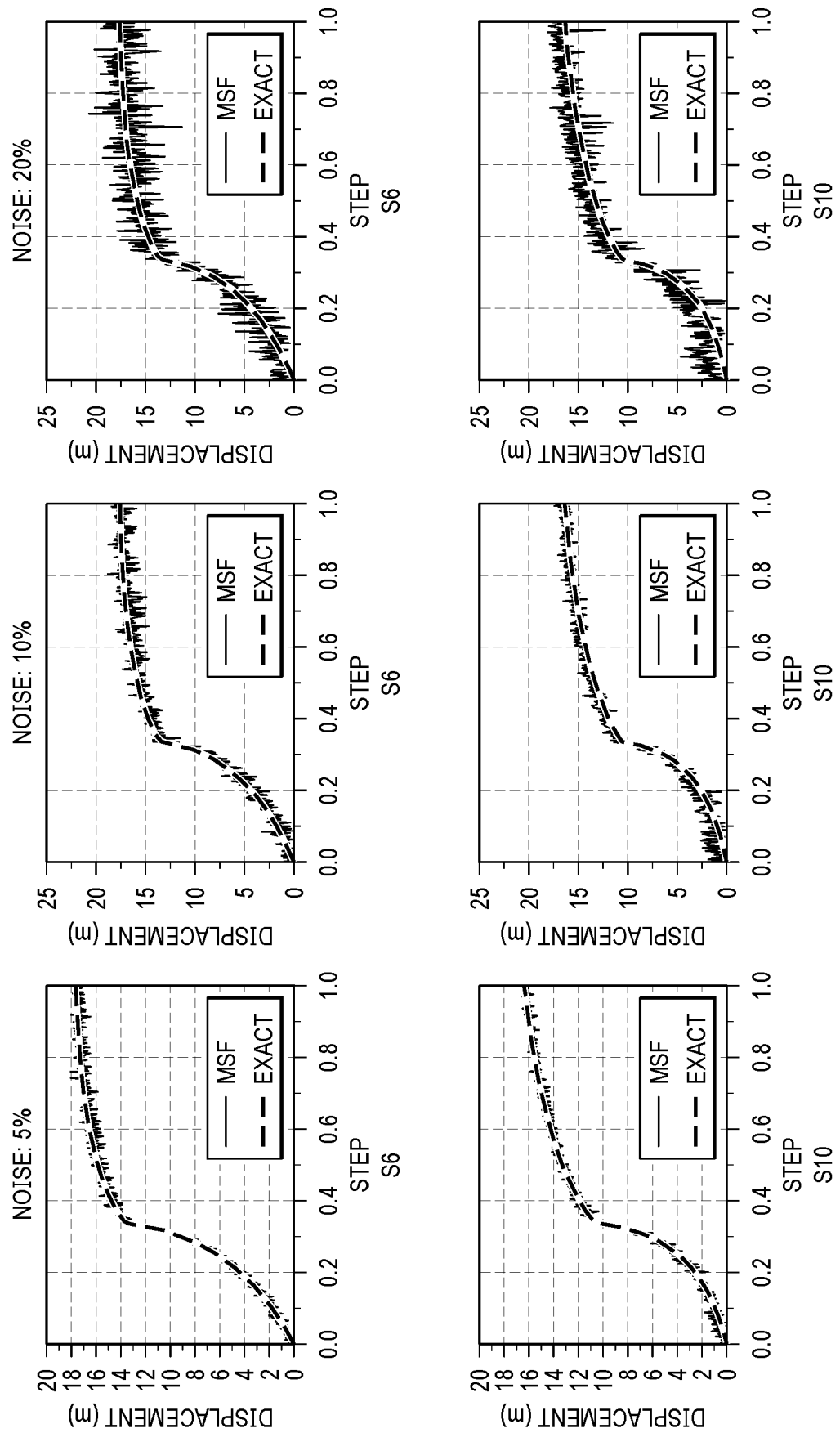
FIG. 7 illustrates graphical representations of embodiments of predicted displacement of geometry and boundary nonlinear behavior.

Turning now to FIG. 7, illustrated are graphical representations of embodiments of predicted displacement of geometry and boundary nonlinear behavior. FIG. 7 shows compared results between exact and predicted displacement at locations S6 and S10 of the inclined beam from intact and noise signals. Geometry and boundary nonlinearities are considered in the behavior of the inclined beam to acquire its displacement and inclination. White noise signals are added to each inclination data set to describe measuring noise effect. A Gaussian function is used to produce white noise, and magnitudes of noises are generated at five percent, 10 percent, and 20 percent of exact signal as indicated in FIG. 7. Five percent noise means that the average of Gaussian function is zero and the variance/standard deviation of Gaussian function is five percent of the maximum inclination.

The step-displacement curves in FIG. 7 represent two different curvatures; the curvature is positive between step 0 and 0.33, and it is negative from step 0.33 to 1.0. This is why the inclined beam touches the ground after step 0.33. In other words, the boundary conditions of the beam are altered during the analysis steps. Changing boundary conditions of the inclined beam can describe the touch down zone characteristic of a catenary riser.

In FIG. 7, patterns of predicted displacement curves match exact displacement curve patterns even though the sensor noise signals are considered. The displacement of MSF does not diverge even though the alternation range of MSF displacement increases according to increasing magnitudes of noise. It is verified that the MSF system is stable from sensor noise, and it reflects geometry and boundary nonlinearities behavior.

Displacement curves predicted from the MSF system and acceleration are compared in case of the column model. Linear dynamic analyses are performed to generate responses of the structure. As previously mentioned, various instant forces are applied to the model. The analyzing time duration is 60 seconds. Dynamic responses can be measured by accelerometers. Accelerometers are widely used in monitoring systems, however, measured acceleration data are not utilized to calculate displacement because of measuring noise.

Figure 8:
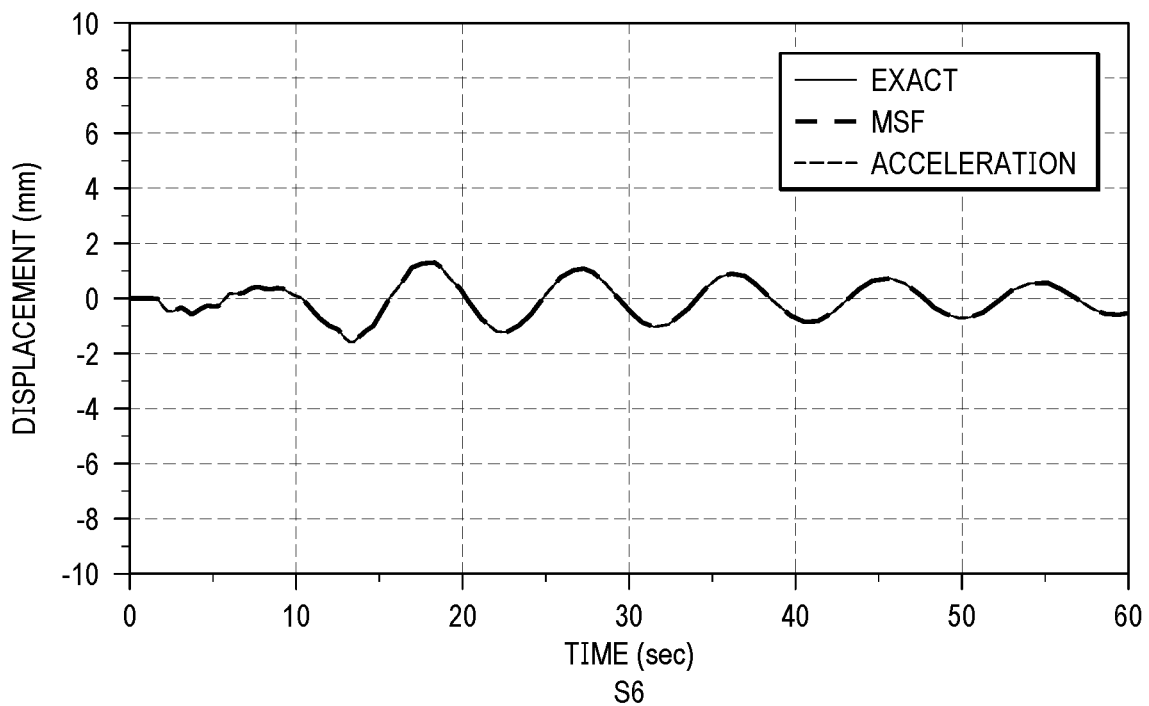
FIG. 8 illustrates graphical representations of embodiments of a predicted reference point displacement of a column model without noise.
Figure 8:
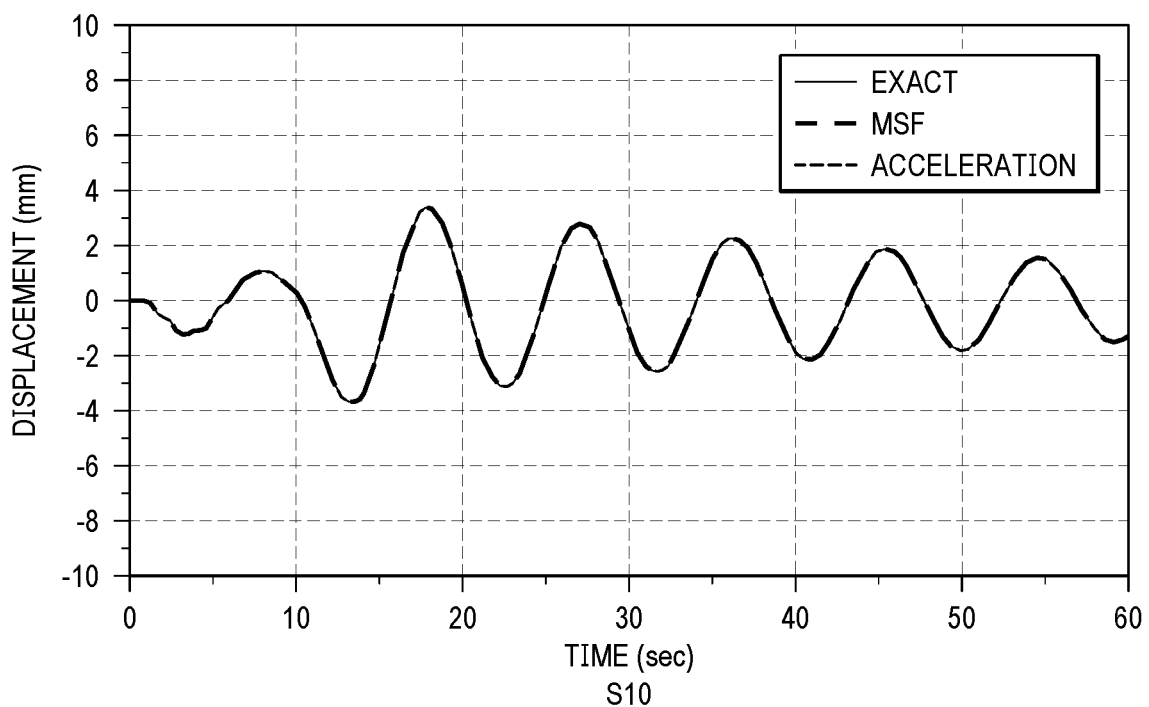

If the measured structure responses are not affected by noise, predicted displacement from both the MSF system and acceleration match the exact displacement as shown in FIG. 8. FIG. 8 illustrates graphical representations of embodiments of a predicted reference point displacement of a column model without noise. FIG. 8 shows displacement history curves at locations S6 and S10. Otherwise, noise is considered in structure response data, and estimated displacement curves are different from exact displacement as shown in FIG. 9.

Figure 9:
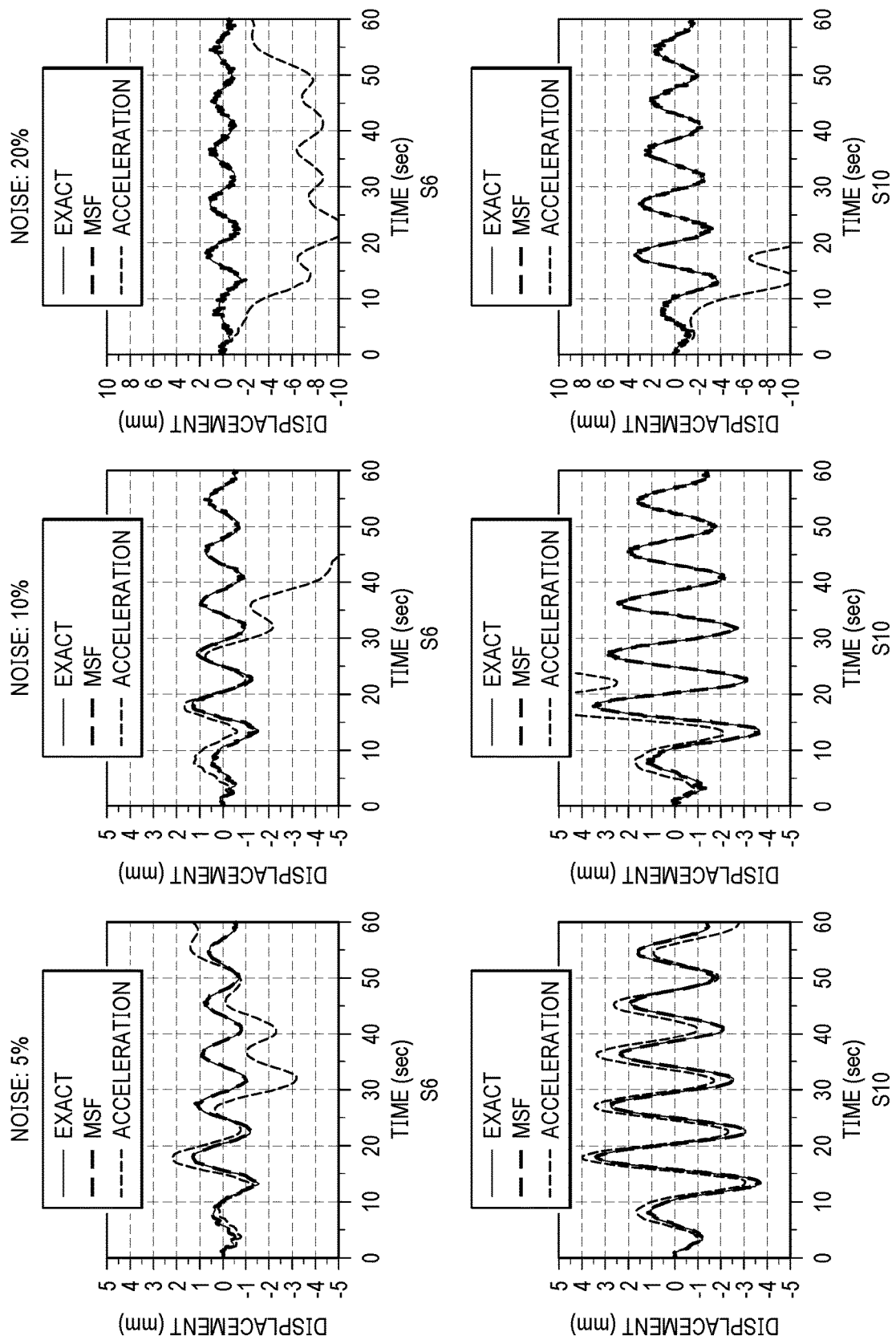
FIG. 9 illustrates graphical representations of embodiments of a predicted reference point displacement of a column model with noise.

Turning now to FIG. 9, illustrated are graphical representations of embodiments of a predicted reference point displacement of a column model with noise. Assumed noise properties are the same as considered noise in FIG. 7. The estimated displacement curves from acceleration appear as a low frequency characteristic, however, small vibration behavior, such as displacement before 10 seconds, is not detected. The biggest limitation of displacement from measured acceleration is that it diverges randomly due to accumulated error. Otherwise, the MSF displacement does not diverge, and it detects small displacement alternation even though it represents high frequency behavior. Therefore, it is verified that the MSF system is appropriate for predicting structure displacement that reflects geometry and boundary nonlinearities.

Figure 10:
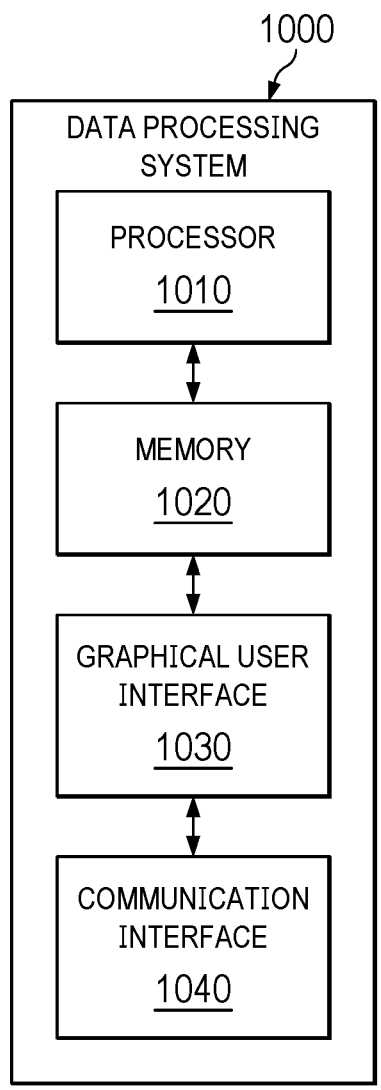
FIG. 10 illustrates a block diagram of an embodiment of at least a portion of an apparatus configured to produce an estimate of a deformed shape of a structure.

Turning now to FIG. 10, illustrated is a block diagram of an embodiment of at least a portion of an apparatus (e.g., a MSF system) configured to produce an estimate of a deformed shape of a structure. The apparatus is or includes a data processing system 1000 that may execute example machine-readable instructions to implement at least a portion of one or more of the methods and/or processes described herein, and/or to implement a portion of one or more of the example apparatus for estimating a deformed shape of a structure such as a riser coupled between a platform and a seabed as described herein. The data processing system 1000 may be or include, for example, one or more processors, controllers, special-purpose computing devices, servers, personal computers, personal digital assistant ("PDA") devices, smartphones, internet appliances, and/or other types of computing devices. Moreover, while it is possible that the entirety of the data processing system 1000 shown in FIG. 10 is implemented within the apparatus for estimating a deformed shape of a riser, it is also contemplated that one or more components or functions of the data processing system 1000 may be implemented, without limitation, in a laptop computer, or tablet.

The data processing system 1000 includes a processor 1010 such as, for example, a general-purpose programmable processor. The processor 1010 may be of any type suitable to the local application environment, and may include one or more of general-purpose computers, special purpose computers, microprocessors, digital signal processors ("DSPs"), field-programmable gate arrays ("FPGAs"), application-specific integrated circuits ("ASICs"), and processors based on a multi-core processor architecture, as non-limiting examples.

The data processing system 1000 also includes memory 1020, which may be one or more memories and of any type suitable to the local application environment, and may be implemented using any suitable volatile or nonvolatile data storage technology such as a semiconductor-based memory device, a magnetic memory device and system, an optical memory device and system, fixed memory and removable memory. The programs stored in the memory 1020 may include program instructions or computer program code that, when executed by an associated processor, enable the respective apparatus to perform its intended tasks. Of course, the memory 1020 may form a data buffer for data transmitted to and from the same. Exemplary embodiments of the system, subsystems, and modules as described herein may be implemented, at least in part, by computer software executable by processors, or by hardware, or by combinations thereof.

The data processing system 1000 may also include a graphical user interface 1030. The graphical user interface 1030 may include or be implemented by various types of standard interfaces, such as an Ethernet interface, a universal serial bus ("USB"), a wireless interface, and/or a cellular interface, among others. The graphical user interface 1030 may also include a graphics driver card. The graphical user interface 1030 may also include one or more input devices to permit a user to enter data and commands into the processor 1010. The graphical interface circuit 1030 may be, include, or be implemented by, for example, a keyboard, a mouse, a touchscreen, a track-pad, a trackball, an isopoint, and/or a voice recognition system, among others.

The data processing system 1000 may further include a communication interface 1040 to provide remote communication capabilities. The communication interface 1040 may a modem or network interface card to facilitate exchange of data with external computing devices via a network (e.g., Ethernet connection, digital subscriber line ("DSL"), telephone line, coaxial cable, cellular telephone system, satellite, etc.).

Thus, the modules and/or other components of the data processing system 1000 may be implemented in accordance with hardware (embodied in one or more chips including an integrated circuit such as an application specific integrated circuit), or may be implemented as software or firmware for execution by a processor. In particular, in the case of firmware or software, the embodiment can be provided as a computer program product including a computer readable medium or storage structure embodying computer program code (i.e., software or firmware) thereon for execution by the processor.

The techniques shown in the FIGUREs illustrated herein can be implemented using code and data stored and executed on one or more apparatus. Such apparatus store and communicate (internally and/or with other communication devices over a network) code and data using non-transitory tangible machine readable medium (e.g., magnetic disks; optical disks; read only memory; flash memory devices; phase-change memory) and transitory machine-readable communication medium (e.g., electrical, optical, acoustical or other forms of propagated signals—such as carrier waves, infrared signals, digital signals, etc.). In addition, such apparatus typically includes a set of one or more processors coupled with one or more other components, such as memory, one or more input/output devices (e.g., keyboard, a touchscreen, and/or a display), and a network connection. The coupling of the set of processors and other components is typically through one or more busses or bridges (also termed bus controllers). The memory and signals carrying the network traffic respectively represent one or more non-transitory tangible machine readable medium and transitory machine-readable communication medium. Thus, the memory of a given apparatus typically stores code and/or data for execution on the set of one or more processors thereof. Of course, one or more parts of an embodiment of the invention may be implemented using different combination of software, firmware, and/or hardware. For example, the techniques shown in the FIGUREs have been described with reference to a specific entity performing the techniques. One of skill in the art would recognize that in other embodiments other or different entities may perform the same techniques. Further entities shown as separate may be combined as one entity in other embodiments without changing the fundamental teachings of the techniques.

Figure 11:
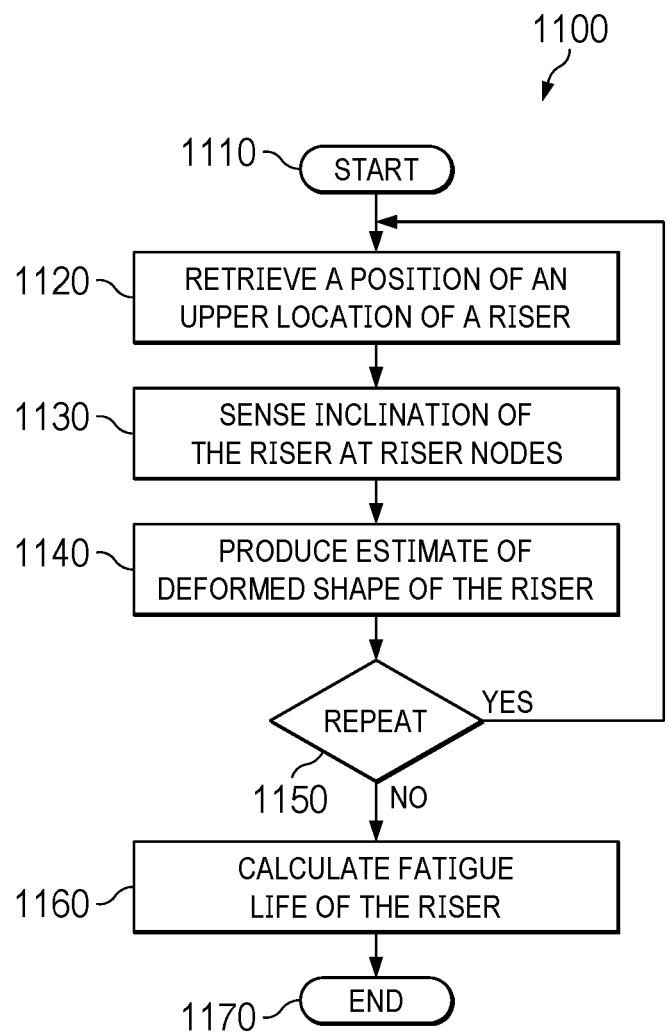
FIG. 11 illustrates a flow diagram of an embodiment of a method of producing an estimate of a deformed shape of a structure.

Turning now to FIG. 11, illustrated is a flow diagram of an embodiment of a method 1100 of producing an estimate of a deformed shape of a structure. With continuing reference to the preceding FIGUREs, the method 1100 will be described with respect to a riser (210) with ends coupled respectively to an upper location (205, e.g., a floating platform) and a lower location (290, e.g., an anchor point 240 in a seabed) and, as an example, configured to conduct a flow of oil and gas. The method 1100 begins at a start step or module 1110, and transitions to retrieving a position of the upper location (205) at a step or module 1120. The position may be determined by a position sensor (245) along, for instance, plural axes and/or with the use of a global navigation satellite system.

At a step or module 1130, the method 1100 continues by sensing an inclination of the riser (210) at riser nodes (FIG. 2, $N_1, \ldots N_n$) positioned on the riser (210) between the upper location (205) and the lower location (290) with, for instance, a sensor such as an inclination sensor (230). The inclination of the riser (210) at the riser nodes (FIG. 2, $N_1, \ldots, N_n$) may be updated at a plurality of time steps. At a step or module 1140, the method 1100 then produces an estimate (Y(x)) of a deformed shape of the riser (210) employing deformed shaped functions (FIG. 3, $y_i(x), \ldots, y_{n-1}(x)$) to represent, respectively, the estimate (Y(x)) of the deformed shape of the riser (210) above and below the riser nodes (FIG. 2, $N_1, \ldots, N_n$) with, for instance, a data processing system (295). In estimating the deformed shape of the riser (210), the method 1100 respectively matches positions, first derivatives, and second derivatives of the deformed shape functions (FIG. 3, $y_1(x), \ldots, y_{n-1}(x)$) at the riser nodes (FIG. 2, $N_1, \ldots, N_n$). Additionally, the first derivatives are matched to the inclination of the riser (210) at the riser nodes (FIG. 2, $N_1, \ldots, N_n$).

The first derivatives, and the second derivatives of the deformed shape functions (FIG. 3, $y_1(x), \ldots, y_{n-1}(x)$) may be calculated separately along orthogonal axes. The deformed shape functions (FIG. 3, $y_1(x), \ldots, y_{n-1}(x)$) may be third-order polynomial functions, and the second derivatives of ones of the deformed shape functions (FIG. 3, $y_1(x), \ldots, y_{n-1}(x)$) are set equal to zero at the upper location (205) and the lower location (290). The estimate (Y(x)) of the deformed shape of the riser (210) may be produced including an objective function to distribute a directional error across a plurality of riser nodes. The objective function may be derived from initial lengths of riser sections (S3) between adjacent riser nodes (FIG. 2, $N_1, \ldots, N_n$).

At decisional step or module 1150, it is determined if the preceding steps of the method 1100 should be repeated (e.g., for a predetermined number such as 10). If the preceding steps should be repeated, return to the step or module 1120, otherwise the method 1100 continues to the step or module 1160. At a step or module 1160, the method 1100 continues by calculating a fatigue life of the riser (210) employing the estimate (Y(x)) of the deformed shape of the riser (210) with, for instance, the data processing system (295). The method 1100 then ends at a stop step or module 1170.

Thus, an apparatus (100) for predicting a deformed shape of a structure and related methods have been introduced herein. In one embodiment, the apparatus (100) is operable with a riser (210) with ends coupled respectively to an upper location (205) and a lower location (290). Sensors such as inclination sensors (230) are configured to sense an inclination of the riser (210) at riser nodes (FIG. 2, $N_1, \ldots, N_n$) positioned on the riser (210) between the upper location (205) and the lower location (290), which may be updated at a plurality of time steps. A data processing system (295) is configured to produce an estimate (Y(x)) of a deformed shape of the riser (210) employing deformed shaped functions (FIG. 3, $y_1(x), \ldots, y_{n-1}(x)$) to represent, respectively, the estimate (Y(x)) of the deformed shape of the riser (210) above and below the riser nodes (FIG. 2, $N_1, \ldots, N_n$).

In an embodiment, positions, first derivatives, and second derivatives of the deformed shape functions (FIG. 3, $y_1(x), \ldots, y_{n-1}(x)$) are respectively matched at the riser nodes (FIG. 2, $N_1, \ldots, N_n$), and the first derivatives are matched to the inclination of the riser (210) at the riser nodes (FIG. 2, $N_1, \ldots, N_n$). In an embodiment, the deformed shape functions (FIG. 3, $y_1(x), \ldots, y_{n-1}(x)$) are third-order polynomial functions. In an embodiment, the deformed shape functions (FIG. 3, $y_1(x), \ldots, y_{n-1}(x)$) are third-order polynomial functions, and second derivatives of ones of the deformed shape functions (FIG. 3, $y_1(x), \ldots, y_{n-1}(x)$) are set equal to zero at the upper location (205) and the lower location (290).

In an embodiment, the apparatus further comprises a position sensor (245) configured to retrieve a position of the upper location (205). The position sensor (245) may retrieve the position of the riser (210) at the upper location (205) along plural axes. A global navigation satellite system may be employed to retrieve the position of the riser (210) where it is coupled to the upper location (205). The upper location (205) may be located on a floating platform, and the lower location (290) may be a known position wherein the riser (210) is coupled to an anchor point (240) in a seabed.

In an embodiment, the positions, the first derivatives, and the second derivatives of the deformed shape functions (FIG. 3, $y_1(x), \ldots, y_{n-1}(x)$) are calculated separately along orthogonal axes. The estimate (Y(x)) of the deformed shape of the riser (210) may be produced including an objective function to distribute a directional error across the riser nodes (FIG. 2, $N_1, \ldots, N_n$). The objective function may be derived from initial lengths of riser sections (S3) between adjacent riser nodes (FIG. 2, $N_1, \ldots, N_n$).

In an embodiment, the data processing system (295) is further configured to calculate a fatigue life of the riser (210) employing the estimate (Y(x)) of the deformed shape of the riser (210). The riser (210) may be configured to conduct a flow of oil and gas.

Those skilled in the art should understand that the previously described embodiments of an apparatus operable with a riser and related methods of operating and forming the same are submitted for illustrative purposes only. While the apparatus has been described in the environment of estimating a deformed shape of a riser, the apparatus may also be applied in other environments such as, without limitation, for estimating a deformed shape of moorings, cables, and girders of bridges.

As described above, the exemplary embodiment provides both a method and corresponding apparatus consisting of various modules providing functionality for performing the steps of the method. The modules may be implemented as hardware (embodied in one or more chips including an integrated circuit such as an application specific integrated circuit), or may be implemented as software or firmware for execution by a processor. In particular, in the case of firmware or software, the exemplary embodiment can be provided as a computer program product including a computer readable storage medium embodying computer program code (i.e., software or firmware) thereon for execution by the computer processor. The computer readable storage medium may be non-transitory (e.g., magnetic disks; optical disks; read only memory; flash memory devices; phase-change memory) or transitory (e.g., electrical, optical, acoustical or other forms of propagated signals-such as carrier waves, infrared signals, digital signals, etc.). The coupling of a processor and other components is typically through one or more busses or bridges (also termed bus controllers). The storage device and signals carrying digital traffic respectively represent one or more non-transitory or transitory computer readable storage medium. Thus, the storage device of a given electronic device typically stores code and/or data for execution on the set of one or more processors of that electronic device such as a controller.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof. Also, many of the features, functions, and steps of operating the same may be reordered, omitted, added, etc., and still fall within the broad scope of the various embodiments.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus operable with a riser with ends coupled respectively to an upper location and a lower location, comprising:
   sensors configured to sense an inclination of said riser at riser nodes positioned on said riser between said upper location and said lower location; and
   a data processing system configured to produce an estimate of a deformed shape of said riser employing deformed shape functions to represent, respectively, said estimate of said deformed shape of said riser above and below said riser nodes, wherein:
      positions, first derivatives, and second derivatives of said deformed shape functions are respectively matched at said riser nodes, and
      said first derivatives are matched to said inclination of said riser at said riser nodes.

2. The apparatus as recited in claim 1 wherein said deformed shape functions are third-order polynomial functions, and said second derivatives of ones of said deformed shape functions are set equal to zero at said upper location and said lower location.

3. The apparatus as recited in claim 1 further comprising a position sensor configured to retrieve a position of said upper location.

4. The apparatus as recited in claim 3 wherein a global navigation satellite system is employed to retrieve said position of said riser where said riser is coupled to said upper location.

5. The apparatus as recited in claim 1 wherein said upper location is a location of a floating platform.

6. The apparatus as recited in claim 1 wherein said lower location is a known position wherein said riser is coupled to an anchor point in a seabed.

7. The apparatus as recited in claim 1 wherein said positions, said first derivatives, and said second derivatives of said deformed shape functions are calculated separately along orthogonal axes.

8. The apparatus as recited in claim 1 wherein said estimate of said deformed shape of said riser is produced including an objective function to distribute a directional error across said riser nodes.

9. The apparatus as recited in claim 8 wherein said objective function is derived from initial lengths of riser sections between adjacent riser nodes.

10. The apparatus as recited in claim 1 wherein said data processing system is further configured to calculate a fatigue life of said riser employing said estimate of said deformed shape of said riser.

11. A method operable with a riser with ends coupled respectively to an upper location and a lower location, comprising:
   sensing an inclination of said riser at riser nodes positioned on said riser between said upper location and said lower location; and
   producing an estimate of a deformed shape of said riser employing deformed shape functions to represent, respectively, said estimate of said deformed shape of said riser above and below said riser nodes, wherein:

positions, first derivatives, and second derivatives of said deformed shape functions are respectively matched at said riser nodes, and said first derivatives are matched to said inclination of said riser at said riser nodes.

12. The method as recited in claim 11 wherein said deformed shape functions are third-order polynomial functions, and said second derivatives of ones of said deformed shape functions are set equal to zero at said upper location and said lower location.

13. The method as recited in claim 11 further comprising retrieving a position of said upper location.

14. The method as recited in claim 13 wherein said retrieving employs a global navigation satellite system to retrieve said position of said riser where said riser is coupled to said upper location.

15. The method as recited in claim 11 wherein said upper location is a location of a floating platform.

16. The method as recited in claim 11 wherein said lower location is a known position wherein said riser is coupled to an anchor point in a seabed.

17. The method as recited in claim 11 wherein said positions, said first derivatives, and said second derivatives of said deformed shape functions are calculated separately along orthogonal axes.

18. The method as recited in claim 11 wherein said producing said estimate of said deformed shape of said riser includes an objective function to distribute a directional error across said riser nodes.

19. The method as recited in claim 18 wherein said objective function is derived from initial lengths of riser sections between adjacent riser nodes.

20. The method as recited in claim 11 further comprising calculating a fatigue life of said riser employing said estimate of said deformed shape of said riser.

* * * * *